(12) United States Patent
Ko

(10) Patent No.: US 6,337,285 B1
(45) Date of Patent: Jan. 8, 2002

(54) SELF-ALIGNED CONTACT (SAC) ETCH WITH DUAL-CHEMISTRY PROCESS

(75) Inventor: Kei-Yu Ko, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/532,088

(22) Filed: Mar. 21, 2000

(51) Int. Cl.⁷ .................. H01L 21/302; B44C 1/22; C03C 15/00
(52) U.S. Cl. .................. 438/714; 438/734; 438/738; 216/67
(58) Field of Search .................. 438/714, 738, 438/142, 689, 706, 734; 216/67, 72

(56) References Cited

U.S. PATENT DOCUMENTS

| 5,817,579 A | 10/1998 | Ko et al. |
| 5,871,659 A | 2/1999 | Sakano et al. |
| 5,946,568 A | 8/1999 | Hsiao et al. |
| 6,074,958 A | * 6/2000 | Tokunaga et al. ........... 438/724 |
| 6,174,451 B1 | * 1/2001 | Hung et al. .................. 216/67 |
| 6,183,655 B1 | * 2/2001 | Wang et al. .................. 216/68 |

* cited by examiner

Primary Examiner—Michael Lebentritt
Assistant Examiner—Adam Pyonin
(74) Attorney, Agent, or Firm—Dickstein Shapiro Morin & Oshinsky LLP

(57) ABSTRACT

The invention is a two-step dual-chemistry process for etching through a selected portion of an insulating oxide layer of a substrate to create a self-aligned contact opening without damaging underlying field oxide regions. The first etching step uses essentially a $C_xF_y$ (x>1)-type chemistry that etches only partially through the oxide layer, since it has very good selectivity to the silicon nitride cap of the gate stacks but a poor selectivity to the field oxide regions. The second etching step employs a second chemistry comprising an H-containing fluorocarbon chemistry. The second chemistry has a good selectivity to the field oxide regions and, at the same time, is able to finish etching the opening.

44 Claims, 3 Drawing Sheets

SELF-ALIGNED CONTACT (SAC) ETCH WITH DUAL-CHEMISTRY PROCESS

FIELD OF THE INVENTION

The present invention relates to a method for etching contacts through layers of an integrated circuit and, in particular, to a self aligned contact (SAC) etch using a dual-chemistry process.

BACKGROUND OF THE INVENTION

The current semiconductor industry poses an ever-increasing pressure for achieving higher device density within a given die area. This is particularly true in memory circuit fabrication, for example DRAM (Dynamic Random Access Memory) manufacture. Each memory cell of a DRAM consists of a single capacitor and a field effect transistor as a charge transfer transistor. The binary data is stored as electrical charge on the capacitor in the individual memory cells. In recent years, the number and density of these memory cells on the DRAM chip has dramatically increased so that the number of memory cells on a single chip is expected to soon reach 1 Gigabit.

The increase in circuit density is the result of the downsizing of the individual semiconductor devices (MOSFETs) and increasing in device packing density. The reduction in device size is due partly to the advances in photolithography and directional (anisotropic) plasma etching. As the horizontal device feature sizes continue to go down to submicrometer dimensions, it is necessary to use self-alignment techniques to relax the alignment requirements and improve critical dimension (CD) control. One such technique is called a self-aligned contact (SAC) etch, in which a pair of adjacent gate s are utilized to align an etched opening in an insulating layer.

The increase in device packing density also places increasing demands on many aspects of the fabrication process. Alignment of features from one level to the next is of critical importance, particularly the alignment of contact holes with underlying structures, for example an active area, with which they are to connect. The miniaturization of the devices makes difficult the formation of interconnect structures in that, in order to maintain sufficient electrical communication, the interconnect structure must be formed in exact alignment with an underlying active region. At the same time, the area of the interconnect structure interfacing with the active area must be maximized. Thus, as device sizes shrink there is less room for misalignment errors of the interconnect structure.

The miniaturization of DRAM devices often requires SAC etch processes, which primarily involve dry etches or plasma etches. Almost all of the current dry etch technology for SAC etch processes uses a $C_xF_y$ (x>1)-type plasma chemistry, such as, for example, $C_4F_8$, $C_5F_8$, or $C_4F_6$ in combination with other diluent gases.

Although the $C_xF_y$ type chemistry offers very high selectivity to the silicon nitride cap and silicon nitride spacers, which are the most typical etch stop material for gate stack protection in a SAC etch, it has the disadvantage that it has a very small process window. This is primarily due to the fact that the $C_xF_y$-type chemistry generates a fluorocarbon polymer which is more carbon rich than the polymers generated with other types of chemistry. With this very carbon-rich fluorocarbon polymer, the etch often results in etch stop condition, a situation when etching stops before reaching the substrate, when the gas flow is off even by a small amount from the optimal setting.

The use of conventional $C_xF_y$-type chemistry has an additional drawback, in that it does not offer any significant selectivity to the field oxide barriers formed by isolation techniques such as STI or LOCOS processes. As an example, the need to not etch the silicon nitride cap during the SAC process demands selective oxide-to-nitride etch conditions, while the need to not etch into the undoped silicon oxide of field oxide regions requires etch selectivity between doped and undoped oxide. These are typically mutually exclusive.

These simultaneous process requirements, which trend in opposing directions, may result in the penetration and damage of the field oxide regions adjacent to the active regions during the etching of the contact holes when oxide-to-nitride selective etch conditions are present and where there is slight misalignment of the location of the holes during the SAC etch process. As a result, the geometry of the STI or LOCOS regions is altered and the overall performance of the semiconductor device being fabricated degraded.

To illustrate this point, FIG. 1 depicts a conventional memory cell construction for a DRAM at an intermediate stage of the fabrication. A pair of memory cells having respective access transistors are formed within a substrate. The wells and transistors are surrounded by a field oxide region 14 that provides isolation. N-type active regions 16 are provided in a doped p-type well 12 of substrate 10 (for NMOS transistors) and the pair of access transistors have respective gate stacks 30.

An insulating layer 24 of, for example, BPSG has been applied over the substrate and transistor structures and a mask layer 26 having openings for etching the insulating layer to form contact openings to active regions 16 are also shown. Theoretically, the mask 26 is properly aligned to enable a SAC etch of the insulating layer 24 to provide contact openings down to the active regions 16.

Because of the nature of a SAC etch, slight misalignment of mask 26 in the left or right directions, as shown by the arrows A in FIG. 1, can be tolerated and allow production of a contact hole which exposes the active areas 16. However, mask 26 misalignment errors in a direction into and out of the FIG. 1 depiction, that is, in the directions B of FIG. 2, can cause a subsequent etch of the insulating layer 24 to produce a contact hole 40 (FIG. 2) which partially overlies the field oxide layer 14. Since the $C_xF_y$ chemistry that etches the insulating layer 24 is not selective to the undoped silicon dioxide forming the field oxide layer 14, etching the contact hole 40 will also result in an undesirable etching of the field oxide layer 14 in the damage region 15.

Ideally, when the contact opening 40 is well aligned with respect to the active area 16 of the substrate 12, field oxide regions 14 are not exposed to the etch chemistry used during the SAC process necessary for the formation of contact opening 40. In practice, however, normal alignment tolerances occur often and thus the field oxide regions are often unavoidably exposed to the etch. Thus, etching through a doped oxide layer with a $C_xF_y$-type chemistry to create a self-aligned contact would inevitably etch into and damage the field oxide regions.

Under the prior art, attempts to minimize damage areas caused by the illustrated misalignment, such as damage region 15, have been mainly directed towards controlling the etch selectivity, that is trying to achieve etch chemistry that etches the BPSG, does not etch the silicon nitride caps and spacers 32 of the gate stacks, and does not etch the field oxide regions 14. This has been accomplished by varying the gas phase chemistry through adjustments in the plasma reactor gases or the operating pressure. For example, U.S. patent application Ser. No. 08/846,671, entitled "Undoped Silicon Dioxide as an Etch Stop for Selective Etch of Doped Silicon Dioxide," the disclosure of which is incorporated herein by reference, discloses the use of hydrogen-containing fluorocarbon gas chemistry to achieve selectivity between doped silicon oxide and undoped silicon oxide.

Although the above referenced patent application discloses an improved method for achieving selectivity between doped and undoped silicon oxide, there is still room for an improved etching regime, which has the ability to operate under a wide range of aspect ratios and which can properly etch through the dielectric layer covering the gate stacks without damaging the underlying field oxide regions.

SUMMARY OF THE INVENTION

The present invention provides a plasma etching process for etching through a selected portion of a doped oxide layer, for example BPSG, on a substrate to create a self-aligned contact without damaging underlying field oxide regions.

The present method includes a first etching step for etching only partially through the doped oxide by employing a first chemistry and a first set of process parameters. The first chemistry uses essentially a $C_xF_y$ (x>1) chemistry, which has a very good selectivity to the silicon nitride cap and silicon nitride spacers provided on the gate stack structures, but which unfortunately has a poor selectivity to field oxide isolation regions. The first step etch is terminated before the doped oxide is etched all the way.

The present invention further includes a second etching step for etching the doped oxide layer through to the underlying silicon layer, with a second chemistry comprising an hydrogen-containing fluorocarbon chemistry and a second set of process parameters. Unlike the first chemistry, however, the hydrogen-containing fluorocarbon chemistry provides a very good selectivity to field oxide isolation regions, while it retains enough nitride selectivity to the gate stack to be capable of etch completion down to the silicon substrate. Thus, the method of the present invention allows the etching of the doped oxide dielectric layer, self-aligned to the gate stacks, without substantially damaging the nitride layer of the gate stack or any misaligned underlying field oxide isolation regions.

The second etch step is performed immediately following the end of the first step. The second etch step could be done by removing the wafer from the etch chamber where the first step is performed, and then transferring the wafer to a different chamber for the second step. Alternatively, the first and second steps could be done "insitu" without breaking the vacuum of the etch chamber or removing the wafer from the etch chamber.

It should be noted that although the invention is described below as employing a two-step etching process, it is also possible to use additional etching steps prior and subsequent to the described two-step process.

Additional advantages and features of the present invention will be more apparent from the detailed description and accompanying drawings, which illustrate preferred embodiments of the invention.

DETAILED DESCRIPTION OF THE PREFERRED EMBODIMENTS

Figure 1:
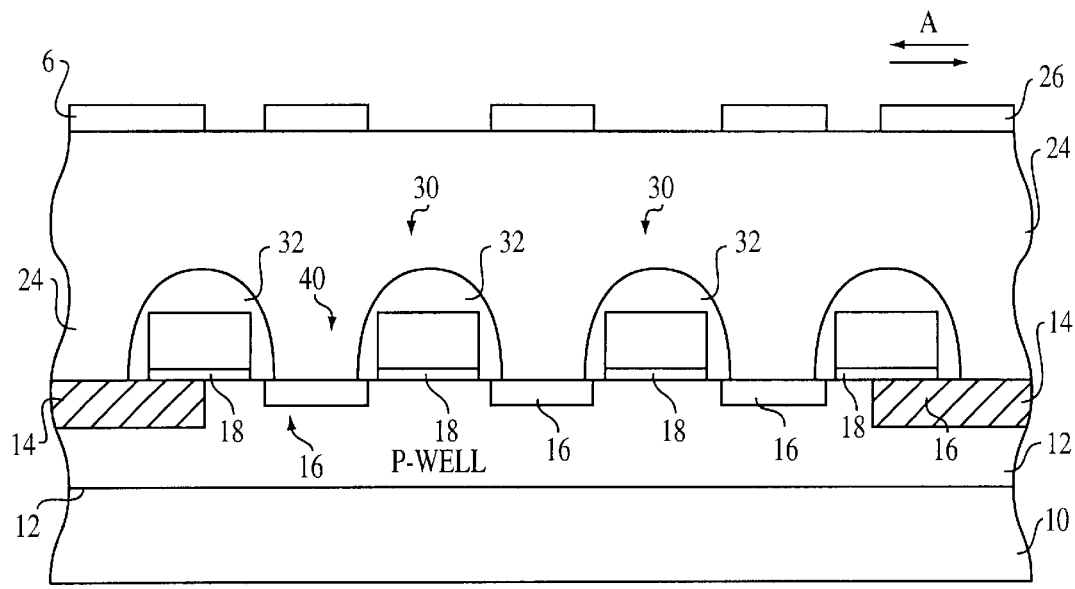
FIG. 1 is a schematic cross-sectional view of a portion of a conventional memory DRAM device just prior to the formation of a self-aligned contact.

In the following detailed description, reference is made to various specific embodiments in which the invention may be practiced. These embodiments are described with sufficient detail to enable those skilled in the art to practice the invention, and it is to be understood that other embodiments may be employed, and that structural, logical, and electrical and process changes may be made without departing from the teachings of the invention.

The terms "wafer" or "substrate" used in the following description may include any semiconductor-based structure that has an exposed silicon surface. Wafer and structure must be understood to include silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to a wafer or substrate in the following description, previous process steps may have been utilized to form regions or junctions or layers in or on the base semiconductor or foundation.

The term "part" is used to indicate one of several equal units of which the gaseous mixtures used in the present invention are comprised. Because all gases are used at identical pressures and temperatures, the term part is used instead of other terminology (e.g., moles) to underscore the importance of using the gases in particular ratios as opposed to in particular amounts.

In the discussion which follows, the invention is described with reference to a self-aligned contact etch as used in the fabrication of memory devices. However, it should be understood that the invention pertains to any applications which require selectivity to an undoped oxide isolation region during the etch of doped silicon oxide dielectric layers.

The present invention provides a plasma etching process for etching through a selected portion of an insulating oxide layer, such as a BPSG layer, in a self-aligned contact etch without damaging an underlying field oxide region which may be present due to mask misalignment.

The method of the present invention comprises a first etching step (first etching stage) for etching partially through the oxide layer of the substrate by employing a first chemistry and a first set of process parameters. The first chemistry uses essentially a $C_xF_y$ (x>1)-type chemistry with a very good selectivity to the silicon nitride cap and silicon nitride spacers of the gate stacks in a SAC structure, but a poor selectivity to the field oxide isolation regions. The first chemistry is used to etch the insulating oxide layer, for example BPSG layer, to a point which does not reach the top surface of an active region formed in a substrate, or, in turn, any field oxide region adjacent to the active region.

The method of the present invention further comprises etching the oxide layer down to the top surface of the active region using a second etching step (second etching stage)

with a second chemistry comprising an hydrogen-containing fluorocarbon chemistry and a second set of process parameters. The hydrogen-containing fluorocarbon chemistry has a very good selectivity to the field oxide isolation region, and it is also capable of finishing the etching down to the active region without damaging the cap and spacers of the gate stacks since it also has a good selectivity to the nitride cap and spacers protecting the gate stack. The method of the present invention allows the etching of the dielectric layer without substantially damaging any misaligned underlying field oxide region.

According to the preferred embodiment, the etching process of the present invention can be carried out in a high density plasma (HDP) etcher, or alternatively, in a reactive ion etcher (RIE), including magnetic-enhanced reactive ion etcher (MERIE). A high density plasma etcher has both a top powered electrode and a bottom electrode, which is typically a biasable electrostatic chuck. Power is applied to both the top and bottom electrodes with separate power supplies. In a reactive ion etcher, the top electrode is typically grounded, and RF power is applied to the bottom electrode.

An inert gas, such as argon or helium, may be added to the plasma source gas to dilute the etching gases and to enhance the uniformity of the etching process. A preferred diluent gas is argon. It must be understood, however that similar effects may be achieved by using other gases, such as helium, although argon is preferred.

Figure 3:
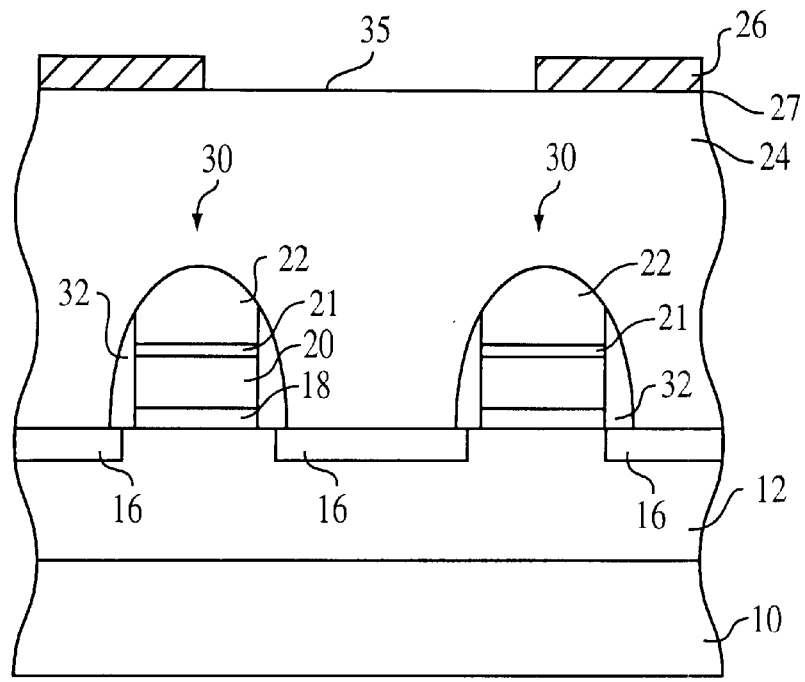
FIG. 3 is a diagram of a memory device at the beginning of a contact opening etch conducted according to the present invention.
Figure 4:
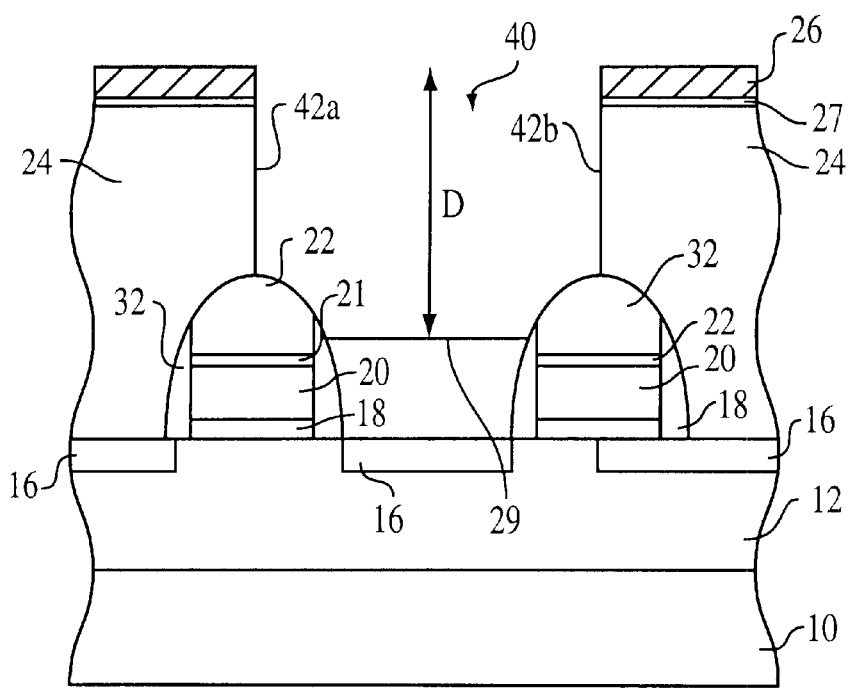
FIG. 4 is a diagram of the FIG. 3 device at a subsequent stage in the processing.
Figure 5:
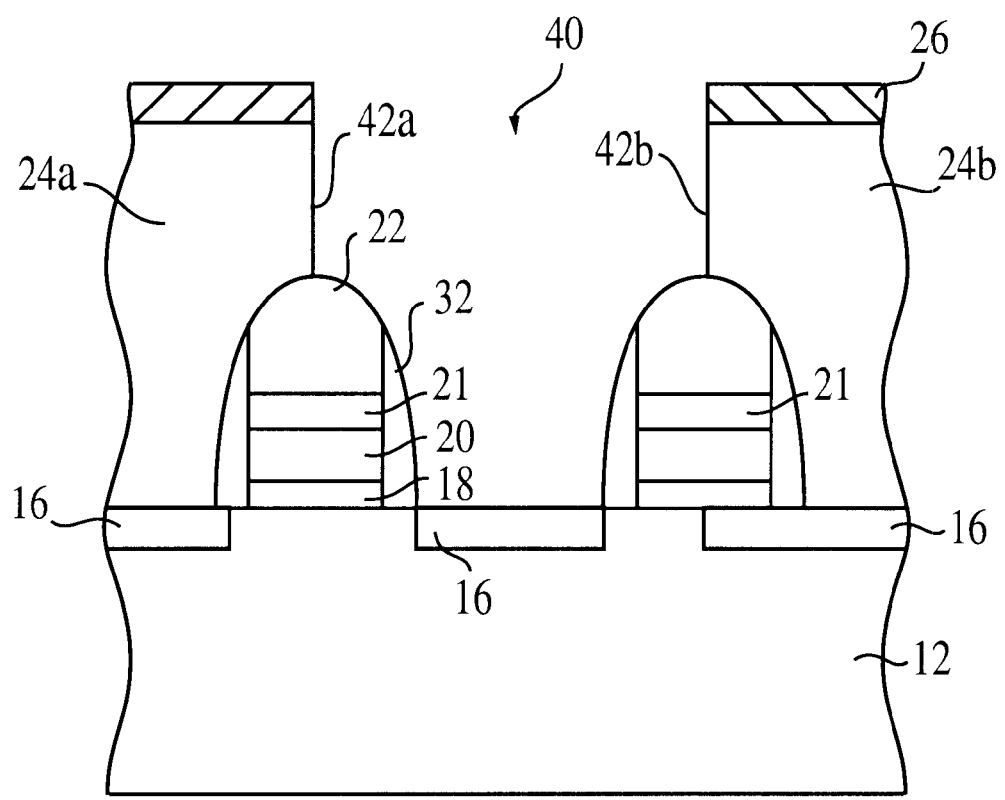
FIG. 5 is a diagram of the FIG. 3 device at a stage subsequent to that shown in FIG. 4.

Referring now to the drawings, where like elements are designated by like reference numerals, a representative etching process according to the present invention is illustrated in FIGS. 3–5. These figures show a middle portion of the FIG. 1 structure in the processing state shown in FIG. 1. The FIG. 3. structure includes a substrate 10 having a p-well 12, which is typically doped to a predetermined conductivity, e.g. p-type or n-type depending on whether NMOS or PMOS transistors will be formed therein. The structure includes conventional doped active areas 16, and a pair of gate stacks 30, all formed according to well-know semiconductor processing techniques.

The gate stacks 30 include an oxide layer 18, a conductive layer 20, such as polysilicon, nitride spacers 32 and a nitride cap 22. A silicide layer is also typically formed between the conductive layer 20 and nitride cap 22. Refractory metal silicide layer 21 may comprise any refractory metal, including but not limited to, titanium, tungsten, tantalum, and molybdenum. Preferably, the refractory metal salicide layer is substantially composed of tungsten silicide ($WSi_x$).

An insulating oxide layer 24, for example a borophosphosilicate glass (BPSG), borosilicate glass (BSG), or phosphosilicate glass (PSG) layer, covers the substrate 10 which contains the gate stacks 30 and active regions 16.

Optionally, an antireflecting coating (ARC) 27 is disposed on top of insulating oxide layer 24.

To create a contact opening 40 into semiconductor substrate 10 through oxide layer 24, a photoresist material 26 is deposited and patterned using conventional photolithography steps. An initial opening 35 is created in photoresist layer 26 for subsequent oxide 24 etching. The structure of FIG. 3 is then etched according to a method of the present invention.

Figure 2:
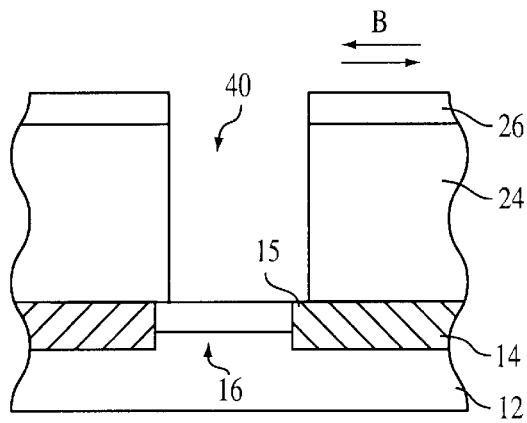
FIG. 2 is a schematic cross sectional view of the FIG. 1 device taken from an angle perpendicular to the view shown in FIG. 1.

Reference is now made to FIG. 4, which shows the FIG. 3 structure with the contact opening 40 partially etched therein. The contact opening 40 is etched to a depth D by a directional etching process such as plasma etching. A first $C_xF_y$ (x>1)-type chemistry is used to etch the doped insulating oxide layer 24, with very good selectivity to the silicon nitride cap 22 and spacer 32 of the gate stacks 30. Since the $C_xF_y$-type chemistry has a poor selectivity to the undoped silicon oxide field isolation regions 14, the etching is continued between the gate stacks down to the depth D, which is less than the total height of the insulating oxide layer 24. That is, contact hole 40 is etched only partially through insulating layer 24, so that the $C_xF_y$ etching chemistry can never reach any misaligned field oxide regions 14, such as depicted in FIG. 2.

The plasma etching process uses a first process gas that comprises a mixture of a $C_xF_y$-type (x>1) gas and a dilute gas, such as argon. The $C_xF_y$-type gas can be selected from, but not limited to $C_4F_8$, $C_4F_6$, or $C_5F_8$. For example, the first process gas could be a gas mixture with a flow rate of 10 sccm of $C_4F_8$ and 500 sci of Ar. However, any other gas flow rate ratio can also be used to achieve different selectivity levels to the silicon nitride cap and spacers. Oxygen or CO may also be added to the gas mixture. Other gas such as $CH_2F_2$ may also be added to the $C_xF_y$ gas mixture, however, the nitride selectivity is primarily determined by the $C_xF_y$ (x>1) gas.

The substrate can be contacted with the first plasma etch for any time sufficient to etch the doped insulating oxide to a distance D, which leaves the bottom 29 of the etched insulating oxide 24 above the field oxide regions 14. It should be understood that these times may vary depending upon the substrate, the etching gas, and the physical parameters of the plasma etch. The distance D, where the first etching step terminates, may be in the range between about the top-of-nitride cap layer and any distance before the etch reaches the substrate and the field isolation regions.

Following the first etch down to distance D, a second plasma etch step is performed that uses a hydrogen-containing fluorocarbon chemistry, which has a high selectivity to the undoped silicon oxide of the field oxide regions 14. The H-containing fluorocarbon etch finishes the contact hole 40 etch in that the doped insulating oxide layer 24 is etched down to the active region 16 and any misaligned field oxide regions 14 in the silicon substrate, without damaging the gate stacks since it also has a good nitride selectivity to the nitride cap and spacers protecting the gate stack.

The second etch step preferably proceeds until the self-aligned contact 40 is etched through to the active region 16 in the substrate 10, as shown in FIG. 5. The use of a hydrogen-containing fluorocarbon chemistry in the second step minimizes damage to the protective nitride regions 22 and 32, and, more importantly, minimizes damage to any misaligned filed oxide region 14.

The hydrogen-containing fluorocarbon gas is preferably selected from the group $CF_4$, $CHF_3$, $CH_2F_2$, $C_2HF_5$, $CH_3F$, and any combinations thereof. An inert gas, such as argon, nitrogen, or helium, is often used in combination with the hydrogen-containing fluorocarbon gas mixture. A preferred gas composition is, for example, $CF_4$, $CHF_3$, $CH_2F_2$, and Ar.

The invention is further explained with reference to the following examples. This invention is not intended to be limited by the particular examples described below. The examples are also described with reference to FIGS. 3–5.

The first etch, which may be carried out in a plasma reactor and a reactive-ion-etching (RIE) or a magnetic-enhanced reactive-ion-etching (MERIE), of the insulating layer 24 is carried out at the following conditions (the gas ratios are approximate ratios):

| | |
|---|---|
| Gases: | $C_4F_8/CH_2F_2/Ar$ 2:1:100 |
| Pressure: | 30–60 mTorr |
| RF Power: | 1000–2000 Watts |
| Magnetic Field: | 0 Gauss–100 Gauss |
| Cathode Temperature: | 0–60 Celsius |
| Gas flows: | $C_4F_8$ 5–20 sccm |
| | $CH_2F_2$ 5–20 sccm |
| | Ar 250–1000 sccm |

As noted, the first etching step is terminated when it reaches the depth D.

The second etch may be carried out in the same plasma reactor using a hydrogen-containing fluorocarbon etch plasma tinder the following conditions (the gas ratios are approximate ratios):

| | |
|---|---|
| Gases: | $CF_4/CHF_3/CH_2F_2/Ar$ 2:4:1:10 |
| Pressure: | 30–60 mTorr |
| RF Power: | 500–1000 Watts |
| Magnetic Field: | 0 Gauss–100 Gauss |
| Cathode Temperature: | 0–60 Celsius |
| Gas flows: | $CF_4$ 10–30 sccm |
| | $CHF_3$ 20–60 sccm |
| | $CH_2F_2$ 10–30 sccm |
| | Ar 50–200 sccm |

This second etching step is preferably performed until the self-aligned contact opening is etched to the active region 16 in the underlying substrate 10.

If the etching process takes place in a high density plasma etcher, the following example is indicative of the etching conditions for the first SAC etching step (the gas ratios are approximate ratios):

| | |
|---|---|
| Gases: | $C_4F_8/CH_2F_2/Ar$ 2:1:100 |
| Pressure: | 1–30 mTorr |
| Top Power: | 500–2000 Watts |
| Bottom Power: | 500–2000 Watts |
| Cathode Temperature: | 0–40 Celsius |
| Gas flows: | $C_4F_8$ 10–30 sccm |
| | $CH_2F_2$ 10–30 sccm |
| | Ar 300–1000 sccm |

The conditions for the second SAC etching step can then be as follows (the gas ratios are approximate ratios):

| | |
|---|---|
| Gases: | $CF_4/CHF_3/Ar$ 1:5:50 |
| Pressure: | 1–30 mTorr |
| Top Power: | 300–1000 Watts |
| Bottom Power: | 300–1000 Watts |
| Cathode Temperature: | 0–40 Celsius |
| Gas flows: | $CF_4$ 10–30 sccm |
| | $CHF_3$ 20–60 sccm |
| | Ar 100–1000 sccm |

The second etch step offers a good oxide-to-nitride selectivity while, at the same time, affords a good selectivity to undoped silicon oxide that form field oxide regions 14.

The above description illustrates preferred embodiments which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of United States is:

1. A method for etching an opening in an insulating oxide layer of a semiconductor device, comprising:

masking said insulating layer to provide an etching area on top of said insulating layer; and etching said insulating layer at said etching area under first etching conditions which employ a plasma chemistry comprising at least one gas selected from the group consisting of $C_2F_6$, $C_2F_4$, $C_3F_8$, $C_4F_8$, $C_4F_{10}$, $C_5F_8$, to form said insulating layer, and next etching said insulating layer at said etching area under second etching conditions which include a hydrogen-containing fluorocarbon chemistry to complete the etching of said opening.

2. The method of claim 1, wherein etching said insulating oxide layer with said first etching conditions is a self-aligned contact etch.

3. The method of claim 1, further comprising forming a field oxide layer in contact with said insulating layer, wherein said partially completed opening in said insulating layer is above said field oxide layer.

4. The method of claim 1, wherein etching of said insulating layer with said first etching conditions employs a reactive ion etch (RIE).

5. The method of claim 1, wherein etching of said insulating layer under first etching conditions employs a reactive ion etch (RIE) and a plasma chemistry comprising a $C_4F_8/CH_2F_2/Ar$ gas mixture.

6. The method of claim 1, wherein etching of said insulating layer under said first etching conditions employs a high density plasma etch and a plasma chemistry comprising a $C_4F_8/CH_2F_2/Ar$ gas mixture.

7. The method of claim 1, wherein etching of said insulating layer under said second etching conditions employs a reactive ion etch (RIE).

8. The method of claim 1, wherein etching of said insulating layer under said second etching conditions further employs a plasma chemistry comprising at least one gas selected from the group consisting of $CF_4$, $CHF_3$, $CH_2F_2$, $C_2HF_5$, and $CH_3F$.

9. The method of claim 8, wherein etching of said insulating layer under said second etching conditions employs a reactive ion etch (RIE) and a plasma chemistry comprising a $CF_4/CHF_3/CH_2F_2/Ar$ gas mixture.

10. The method of claim 1, wherein etching of said insulating layer under said second etching conditions employs a high density plasma etch and a plasma chemistry comprising a $CF_4/CHF_3/Ar$ gas mixture.

11. The method of claim 1, wherein said insulating layer is selected from the group consisting of BPSG, BSG, and PSG.

12. The method of claim 1, wherein said semiconductor device is formed of mono crystalline silicon.

13. The method of claim 5 wherein the ratio of $C_4F_8/CH_2F_2/Ar$ gases in said gas mixture is approximately 2:1:100.

14. The method of claim 6 wherein the ratio of $C_4F_8/CH_2F_2/Ar$ gases in said gas mixture is approximately 2:1:100.

15. The method of claim 9 wherein the ratio of $CF_4/CHF_3/CH_2F_2/Ar$ gases in said gas mixture is approximately 2:4:1:10.

16. The method of claim 10 wherein the ratio of $CF_4$/$CHF_3$/Ar gases in said gas mixture is approximately 1:5:50.

17. A method for etching an insulating layer of a semiconductor device provided on a substrate selective to a field oxide region provided on said substrate below said insulating layer, said method comprising:
   etching said insulating layer under first etching conditions which include a $C_xF_y$(x>1)-type chemistry to form an opening in said insulating layer, terminating said etching of said opening process before reaching a level of said field oxide region; and,
   continuing an etching of said opening under second etching conditions which include a hydrogen-containing fluorocarbon chemistry.

18. The method of claim 17, wherein etching said insulating layer under said first etching conditions is a self-aligned contact etch.

19. The method of claim 17, wherein etching of said insulating layer under said first etching conditions employs a reactive ion etch (RIE).

20. The method of claim 17, wherein etching of said insulating layer under said first etching conditions employs a plasma chemistry comprising at least one gas selected from the group consisting of $C_2F_6$, $C_2F_8$, $C_3F_8$, $C_4F_8$, $C_4F_6$, $C_4F_{10}$, $C_5F_8$.

21. The method of claim 20, wherein the etching of said insulating layer under said first etching conditions employs a reactive ion etch (RIE) and a plasma chemistry comprising a $C_4F_8$/$CH_2F_2$/Ar gas mixture.

22. The method of claim 20, wherein etching of said insulating layer under said first etching conditions employs a high density plasma etch and a plasma chemistry comprising a $C_4F_8$/$CH_2F_2$/Ar gas mixture.

23. The method of claim 17, wherein etching of said insulating layer under said second etching conditions employs a reactive ion etch (RIE).

24. The method of claim 17, wherein etching of said insulating layer under said second etching conditions employs a plasma chemistry including at least one gas selected from the group consisting of $CF_4$, $CHF_3$, $CH_2F_2$, $C_2HF_5$, and $CH_3F$.

25. The method of claim 24, wherein etching of said insulating layer under said second etching conditions employs a reactive ion etch (RIE) and a plasma chemistry comprising a $CF_4$/$CHF_3$/$CH_2F_2$/Ar gas mixture.

26. The method of claim 24, wherein etching of said insulating layer under said second etching conditions employs a high density plasma etch and a plasma chemistry comprising a $CF_4$/$CHF_3$/Ar gas mixture.

27. The method of claim 17, wherein said insulating layer is selected from the group consisting of BPSG, BSG, and PSG.

28. The method of claim 17, wherein said semiconductor substrate is formed of mono crystalline silicon.

29. The method of claim 21 wherein the ratio of $C_4F_8$/$CH_2F_2$/Ar gases in said gas mixture is approximately 2:1:100.

30. The method of claim 22 wherein the ratio of $C_4F_8$/$CH_2F_2$/Ar gases in said gas mixture is approximately 2:1:100.

31. The method of claim 25 wherein the ratio of $CF_4$/$CHF_3$/$CH_2F_2$/Ar gases in said gas mixture is approximately 2:4:1:10.

32. The method of claim 26 wherein the ratio of $CF_4$/$CHF_3$/Ar gases in said gas mixture is approximately 1:5:50.

33. The method of claim 17 wherein the continuation of said etching under second etching conditions is a self-aligned contact etch.

34. A method for etching an opening in an insulating oxide layer of a semiconductor device, comprising:
   masking said insulating layer to provide an etching area on top of said insulating layer;
   etching said insulating layer at said etching area under first etching conditions which include a $C_xF_y$(x>1)-type chemistry to form a partially completed opening in said insulating layer, and further etching said insulating layer under second etching conditions which include a hydrogen-containing fluorocarbon chemistry to complete the etching of said opening; and
   said first etching conditions being carried out in a plasma reactor (RIE) under the following conditions, with the gas ratios being approximate:

| | |
|---|---|
| Gases: | $C_4F_8$/$CH_2F_2$/Ar 2:1:100 |
| Pressure: | 30–60 mTorr |
| RF Power: | 1000–2000 Watts |
| Magnetic Field: | 0 Gauss–100 Gauss |
| Cathode Temperature: | 0–60 Celsius |
| Gas flows: | $C_4F_8$ 5–20 sccm |
| | $CH_2F_2$ 5–20 sccm |
| | Ar 250–1000 sccm. |

35. A method for etching an opening in an insulating oxide layer of a semiconductor device, comprising:
   masking said insulating layer to provide an etching area on top of said insulating layer;
   etching said insulating layer at said etching area under first etching conditions which include a $C_xF_y$(x>1)-type chemistry to form a partially completed opening in said insulating layer, and further etching said insulating layer under second etching conditions which include a hydrogen-containing fluorocarbon chemistry to complete the etching of said opening; and
   said first etching conditions being carried out in a high density plasma reactor under the following conditions, with the gas ratios being approximate:

| | |
|---|---|
| Gases: | $C_4F_8$/$CH_2F_2$/Ar 2:1:100 |
| Pressure: | 1–30 mTorr |
| Top Power: | 500–2000 Watts |
| Bottom Power: | 500–2000 Watts |
| Cathode Temperature: | 0–40 Celsius |
| Gas flows: | $C_4F_8$ 10–30 sccm |
| | $CH_2F_2$ 10–30 sccm |
| | Ar 300–1000 sccm. |

36. A method for etching an opening in an insulating oxide layer of a semiconductor device, comprising:
   masking said insulating layer to provide an etching area on top of said insulating layer;
   etching said insulating layer at said etching area under first etching conditions which include a $C_xF_y$(x>1)-type chemistry to form a partially completed opening in said insulating layer, and further etching said insulating layer under second etching conditions which include a hydrogen-containing fluorocarbon chemistry to complete the etching of said opening; and
   said second etching conditions being carried out in a plasma reactor (RIE,) under the following conditions, with the gas ratios being approximate:

| | |
|---|---|
| Gases: | $CF_4/CHF_3/CH_2F_2/Ar$ 2:4:1:10 |
| Pressure: | 30–60 mTorr |
| RF Power: | 500–1000 Watts |
| Magnetic Field: | 0 Gauss–100 Gauss |
| Cathode Temperature: | 0–60 Celsius |
| Gas flows: | $CF_4$ 10–30 sccm |
| | $CHF_3$ 20–60 sccm |
| | $CH_2F_2$ 10–30 sccm |
| | Ar 50–200 sccm. |

37. A method for etching an opening in an insulating oxide layer of a semiconductor device, comprising:
   masking said insulating layer to provide an etching area on top of said insulating layer;
   etching said insulating layer at said etching area under first etching conditions which include a $C_xF_y(x>1)$-type chemistry to form a partially completed opening in said insulating layer, and further etching said insulating layer under second etching conditions which include a hydrogen-containing fluorocarbon chemistry to complete the etching of said opening; and
   said second etching conditions being carried out in a high density plasma reactor under the following conditions, with the gas ratios being approximate:

| | |
|---|---|
| Gases: | $CF_4/CHF_3/Ar$ 1:5:50 |
| Pressure: | 1–30 mTorr |
| Top Power: | 300–1000 Watts |
| Bottom Power: | 300–1000 Watts |
| Cathode Temperature: | 0–40 Celsius |
| Gas flows: | $CF_4$ 10–30 sccm |
| | $CHF_3$ 20–60 sccm |
| | Ar 100–1000 sccm. |

38. A method for etching an opening in an insulating oxide layer of a semiconductor device, comprising:
   masking said insulating layer to provide an etching area on top of said insulating layer; and
   etching said insulating layer at said etching area under first etching conditions which include a $C_xF_y(x>1)$-type chemistry to form a partially completed opening in said insulating layer, and next etching said insulating layer at said etching area under second etching conditions which include a hydrogen-containing fluorocarbon chemistry and which do not include all components of said first etching conditions, to complete the etching of said opening.

39. The method of claim 38, wherein etching of said insulating layer with said first etching conditions employs a reactive ion etch (RIE).

40. The method of claim 39, wherein etching of said insulating layer with said first etching conditions further employs a plasma chemistry comprising at least one gas selected from the group consisting of $C_2F_6$, $C_2F_8$, $C_3F_8$, $C_4F_8$, $C_4F_6$, $C_4F_{10}$, $C_5F_8$.

41. The method of claim 40, wherein etching of said insulating layer under said first etching conditions employs a reactive ion etch (RIE) and a plasma chemistry comprising a $C_4F_8/CH_2F_2/Ar$ gas mixture.

42. The method of claim 38, wherein etching of said insulating layer under said second etching conditions employs a reactive ion etch (RIE).

43. The method of claim 42, wherein etching of said insulating layer under said second etching conditions further employs a plasma chemistry comprising at least one gas selected from the group consisting of $CF_4$, $CHF_3$, $CH_2F_2$, $C_2HF_5$, and $CH_3F$.

44. The method of claim 43, wherein etching of said insulating layer under said second etching conditions employs a reactive ion etch (RIE) and a plasma chemistry comprising a $CF_4/CHF_3/CH_2F_2/Ar$ gas mixture.

* * * * *